United States Patent
Takahashi

(10) Patent No.: US 9,196,488 B2
(45) Date of Patent: Nov. 24, 2015

(54) SEMICONDUCTOR DEVICE AND MANUFACTURING METHOD THEREOF

(71) Applicant: MITSUBISHI ELECTRIC CORPORATION, Tokyo (JP)

(72) Inventor: Tetsuo Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/150,500

(22) Filed: Jan. 8, 2014

(65) Prior Publication Data

US 2014/0299962 A1    Oct. 9, 2014

(30) Foreign Application Priority Data

Apr. 8, 2013    (JP) .................. 2013-080695

(51) Int. Cl.
| | |
|---|---|
| H01L 23/58 | (2006.01) |
| H01L 21/425 | (2006.01) |
| H01L 21/265 | (2006.01) |
| H01L 29/06 | (2006.01) |
| H01L 21/266 | (2006.01) |
| H01L 29/40 | (2006.01) |
| H01L 29/739 | (2006.01) |

(52) U.S. Cl.
CPC ............ *H01L 21/265* (2013.01); *H01L 21/266* (2013.01); *H01L 29/063* (2013.01); *H01L 29/404* (2013.01); *H01L 29/7397* (2013.01)

(58) Field of Classification Search
CPC .............. H01L 29/404; H01L 29/0634; H01L 29/0623; H01L 29/7835; H01L 29/0615
USPC ......................................... 257/335, 487, 493
See application file for complete search history.

(56) References Cited

U.S. PATENT DOCUMENTS

| 5,455,439 | A | 10/1995 | Terashima et al. |
| 6,054,748 | A | 4/2000 | Tsukuda et al. |
| 7,476,942 | B2 * | 1/2009 | Watanabe et al. ............. 257/370 |
| 7,732,821 | B2 * | 6/2010 | Suzuki et al. .................... 257/77 |
| 2004/0145027 | A1 | 7/2004 | Nitta et al. |
| 2006/0124997 | A1 | 6/2006 | Yamauchi et al. |
| 2006/0131685 | A1 | 6/2006 | Watanabe et al. |

(Continued)

FOREIGN PATENT DOCUMENTS

| JP | 05-190693 A | 7/1993 |
| JP | 10-321877 A | 12/1998 |
| JP | 2002-231944 A | 8/2002 |
| JP | 2002-261283 A | 9/2002 |
| JP | 2004-228466 A | 8/2004 |

(Continued)

OTHER PUBLICATIONS

The Institute of Electrical Engineers of Japan, edited by Electron Device Society Power Device 7 IC Technical Committee (1996) "Power Semiconductor Device/Power IC Handbook" Corona Publishing Co., Ltd., pp. 54-64 & pp. 170-174.

*Primary Examiner* — Hsien Ming Lee
(74) *Attorney, Agent, or Firm* — Studebaker & Brackett PC

(57) ABSTRACT

A semiconductor device includes: a layer of a first conductivity type; a well of a second conductivity type on the layer of the first conductivity type in an active region; and a flat RESURF layer of the second conductivity type on the layer of the first conductivity type on an outer circumference of the well as a termination structure. The RESURF layer includes a low concentration layer arranged at an inner end on the well side and an outer end on the outer circumferential side, and a high concentration layer arranged between the inner end and the outer end and having a higher impurity concentration than the low concentration layer.

5 Claims, 6 Drawing Sheets

(56) References Cited

U.S. PATENT DOCUMENTS

| | | |
|---|---|---|
| 2010/0252904 A1 | 10/2010 | Takahashi et al. |
| 2013/0161645 A1* | 6/2013 | Takahashi ........................ 257/77 |
| 2014/0374871 A1* | 12/2014 | Hirabayashi et al. ......... 257/488 |

FOREIGN PATENT DOCUMENTS

| | | |
|---|---|---|
| JP | 2006-173202 A | 6/2006 |
| JP | 2006-173437 A | 6/2006 |
| JP | 2010-245281 A | 10/2010 |

* cited by examiner

SEMICONDUCTOR DEVICE AND MANUFACTURING METHOD THEREOF

BACKGROUND OF THE INVENTION

1. Field of the Invention

The present invention relates to a semiconductor device having a termination structure which is an electric field relaxing structure provided in a device termination region and a manufacturing method thereof, and more particularly, to a semiconductor device capable of reducing an area occupied by a termination structure while maintaining a stable withstand voltage and a manufacturing method thereof.

2. Background Art

Power devices are semiconductor elements mainly intended for power apparatuses used for power conversion, power control or the like and designed to have a higher withstand voltage and a higher current than those of normal semiconductor elements. The power devices need to shut off a current when a reverse voltage is applied and maintain a high voltage. As methods of increasing a withstand voltage of a power device, a termination structure such as an FLR (field limiting ring) structure and a field plate structure are disclosed (e.g., see The Institute of Electrical Engineers of Japan, edited by Electron Device Society Power Device & IC Technical Committee, "Power Device/Power IC Handbook," CORONA PUBLISHING CO., LTD., p54 to 64 and 170 to 174).

Of these structures, the FLR structure is a structure in which a principal junction made up of a low concentration n-type impurity region and a p-type impurity region formed on an inner surface of the n-type impurity region is surrounded by a plurality of ring-shaped p-type impurity regions. This structure relaxes an electric field of a substrate surface and maintains a withstand voltage.

However, since the FLR structure relaxes the electric field in the low concentration n-type impurity region located between the plurality of ring-shaped p-type impurity regions, when the withstand voltage of the semiconductor device is increased using the FLR structure, there is a problem that the area of the outer circumferential portion of the principal junction increases, resulting in an increase in the area occupied by the semiconductor device.

In contrast, a semiconductor device is proposed which is provided with a termination structure that maintains a withstand voltage using a p-type RESURF layer which is an impurity layer set to an impurity concentration and a depth that satisfy RESURF conditions under which when a high reverse voltage to be maintained is applied, the p-type RESURF layer is completely depleted (e.g., see Japanese Patent Laid-Open No. 2010-245281). This eliminates the necessity for forming a plurality of ring-shaped p-type impurity regions to maintain the withstand voltage, and can thereby reduce the area occupied by the termination structure while maintaining the withstand voltage.

SUMMARY OF THE INVENTION

However, the prior art involves a problem that an electric field is likely to concentrate on an end of the p-type RESURF layer. This leads to another problem that the withstand voltage is not stable.

In view of the above-described problems, an object of the present invention is to provide a semiconductor device and a manufacturing method thereof which can reduce the area occupied by the termination structure and maintain a stable withstand voltage.

According to the present invention, a semiconductor device includes: a layer of a first conductivity type; a well of a second conductivity type on the layer of the first conductivity type in an active region; and a flat RESURF layer of the second conductivity type on the layer of the first conductivity type on an outer circumference of the well as a termination structure, wherein the RESURF layer includes a low concentration layer arranged at an inner end on the well side and an outer end on the outer circumferential side, and a high concentration layer arranged between the inner end and the outer end and having a higher impurity concentration than the low concentration layer.

The present invention makes it possible to reduce the area occupied by the termination structure and maintain a stable withstand voltage.

Other and further objects, features and advantages of the invention will appear more fully from the following description.

DETAILED DESCRIPTION OF THE PREFERRED EMBODIMENTS

A semiconductor device and a manufacturing method thereof according to the embodiments of the present invention will be described with reference to the drawings. The same components will be denoted by the same symbols, and the repeated description thereof may be omitted.

First Embodiment

Figure 1:
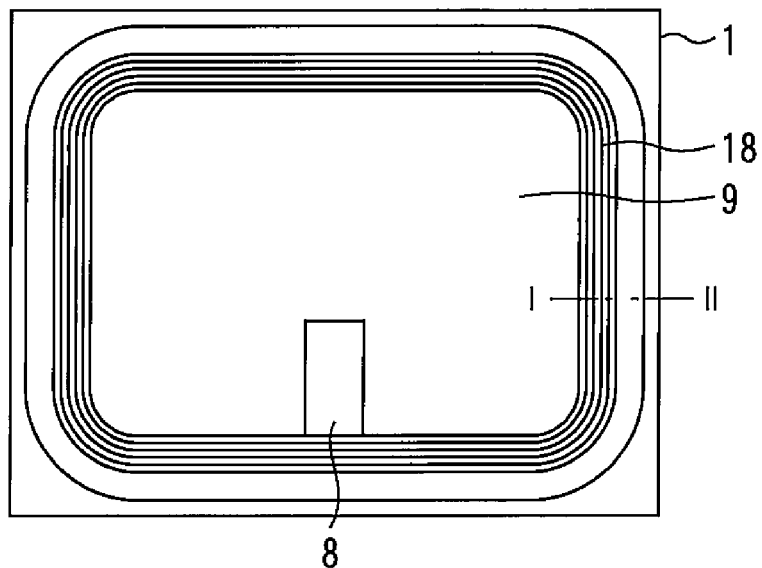
FIG. 1 is a plan view illustrating a semiconductor device according to a first embodiment of the present invention.
Figure 2:
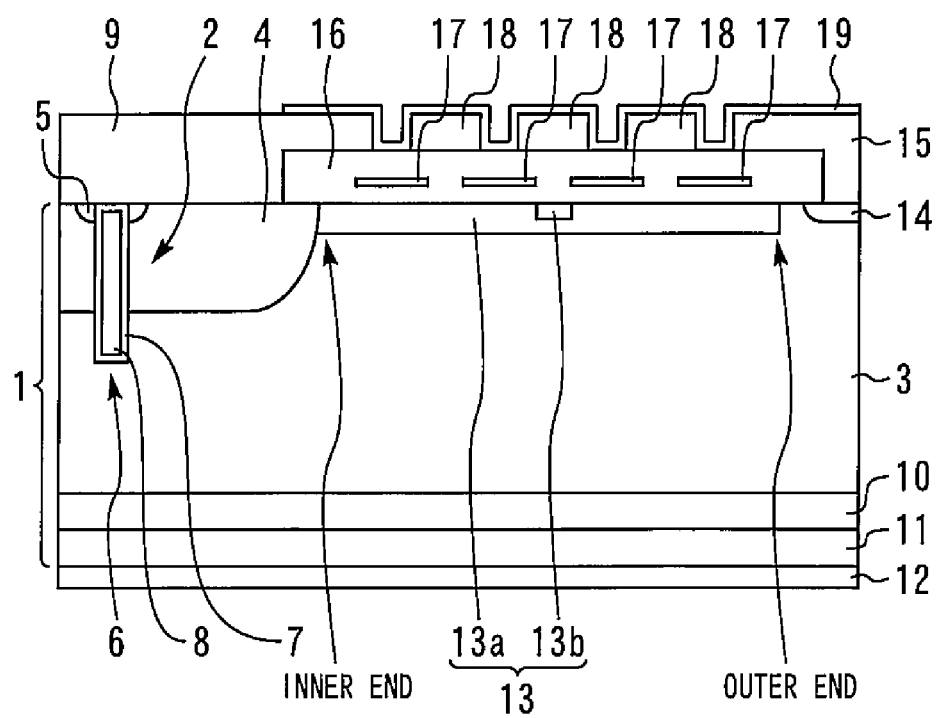
FIG. 2 is a cross-sectional view along I-II in FIG. 1.

FIG. 1 is a plan view illustrating a semiconductor device according to a first embodiment of the present invention. FIG. 2 is a cross-sectional view along I-II in FIG. 1. An IGBT (integrated gate bipolar transistor) 2 is provided in an active region in the center of a substrate 1 and a termination structure is provided therearound.

First, the structure of the IGBT 2 will be described. A p-type well 4 is provided on an n⁻-type layer 3 of a substrate 1 made of silicon. An n⁺-type source layer 5 is provided in part of the p-type well 4. A trench 6 is provided so as to penetrate the p-type well 4 and the n⁺-type source layer 5. A gate electrode 8 made of polysilicon is embedded in the trench 6 via a gate oxide film 7. An emitter electrode 9 made of metal such as Al (aluminum) is provided on the substrate 1 and connected to the p-type well 4 and the n⁺-type source layer 5. An n⁺-type buffer layer 10 and a p⁺-type collector layer 11 are provided in that order below the n⁺-type layer 3 of the substrate 1. A collector electrode 12 made of metal such as Al is connected to the p⁺-type collector layer 11.

Next, the termination structure will be described. A flat p-type RESURF (reduced surface field) layer 13 is provided on the n⁻-type layer 3 on the outer circumference of the p-type well 4. The p-type RESURF layer 13 is set to an impurity concentration and a depth that satisfy a RESURF condition for the p-type RESURF layer 13 to be completely depleted. The p-type well 4 is in contact with an end of the p-type RESURF layer 13 on the center side of the substrate. The p-type well 4 has a higher p-type impurity concentration than the p-type RESURF layer 13. Note that since the main surface of the substrate 1 is flat, the top surface of the p-type RESURF layer 13 is also flat.

An n-type channel stopper 14 is provided on the n⁻-type layer 3 closer to the outer circumferential side than the p-type RESURF layer 13. The n-type channel stopper 14 has a higher n-type impurity concentration than the n⁻-type layer 3. A channel stopper electrode 15 is connected to the n-type channel stopper 14. A field insulating film 16 is provided on the p-type RESURF layer 13. Note that the channel stopper electrode 15 is made of metal such as Al as in the case of the emitter electrode 9 and the field insulating film 16 is made of silicon oxide.

A plurality of base field plates 17 are provided in the field insulating film 16. The base field plates 17 are flat plates substantially parallel to the top surface of the substrate 1, are insulated from each other and have a floating potential. Top field plates 18 are provided on the field insulating film 16. The top field plates 18 are flat plates substantially parallel to the top surface of the substrate 1, are insulated from each other and have a floating potential. The base field plate 17, the top field plates 18, the emitter electrode 9 and the channel stopper electrode 15 partially overlap with each other to constitute a capacitance. The channel stopper electrode 15 and the top field plates 18 are covered with a passivation film 19. The plurality of base field plates 17 are made of, for example, polysilicon and the top field plates 18 are made of metal such as Al as in the case of the emitter electrode 9.

As a feature of the present embodiment, the p-type RESURF layer 13 includes a low concentration layer 13a arranged at the inner end on the p-type well 4 side and the outer end on the outer circumferential side, and a high concentration layer 13b arranged between the inner end and the outer end having a higher impurity concentration than the low concentration layer 13a. The high concentration layer 13b is also set to an impurity concentration and a depth that satisfy a RESURF condition under which the high concentration layer 13b is completely depleted. Note that the high concentration layer 13b is formed by selectively injecting impurity ions into the substrate 1 before or after the step of forming the low concentration layer 13a.

When a reverse voltage is applied and the potential of the collector electrode 12 becomes higher relative to the potential of the emitter electrode 9, a depletion layer extends from the n⁻-type channel stopper 14 side (high voltage side) to the p-type well 4 side (low voltage side). In this case, the extending speed of the depletion layer that has extended from the n-type channel stopper 14 temporarily slows down at the high concentration layer 13b. However, since the high concentration layer 13b satisfies the RESURF condition, it is depleted when a certain voltage is maintained and the depletion starts to advance toward the p-type well 4 side again. As a result, the p-type RESURF layer 13 is completely depleted and the withstand voltage is maintained by this depletion layer.

Figure 3:
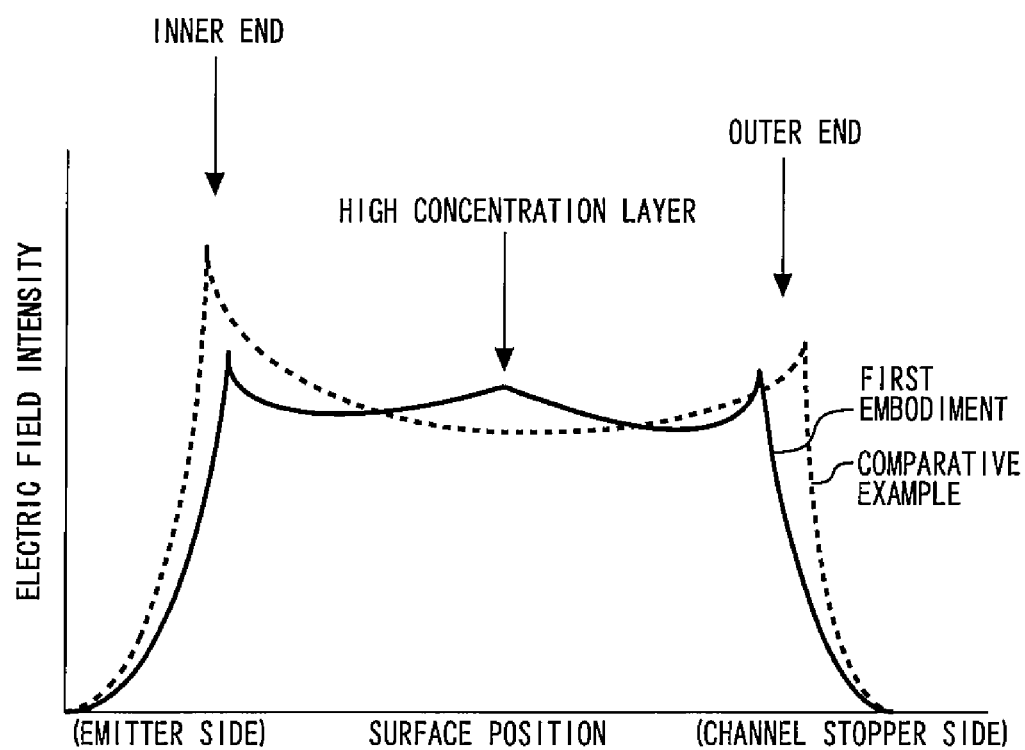
FIG. 3 is a diagram illustrating an electric field distribution on the substrate surface according to the first embodiment and the comparative example.

Next, effects of the present embodiment will be described in comparison with a comparative example. In the comparative example, the p-type RESURF layer 13 has no high concentration layer 13b. FIG. 3 is a diagram illustrating an electric field distribution on the substrate surface according to the first embodiment and the comparative example.

When a depletion layer is formed in the entire p-type RESURF layer 13, the electric field concentrates on a junction between the p-type well 4 and the inner end of the p-type RESURF layer 13 and a junction between the outer end of the p-type RESURF layer 13 and the n⁻-type layer 3 in the comparative example. Therefore, the electric field concentrates on two locations; the inner end and the outer end of the p-type RESURF layer 13, presenting a so-called suspension-bridge-shaped electric field distribution. Since avalanche breakdown is more likely to occur in this electric field concentrated portion than other parts, the withstand voltage is not stable.

On the other hand, in the present embodiment, since the high concentration layer 13b is provided in the center of the p-type RESURF layer 13, the electric field rises at this part, allowing the electric field at the inner end and the outer end to relatively decrease. This relaxes the concentration of the electric field in the depletion layer and flattens the electric field distribution. As a result, a maximum electric field peak lowers and the withstand voltage is thereby stabilized. Therefore, the area occupied by the termination structure can be reduced by narrowing the width of the p-type RESURF layer 13 while maintaining a stable withstand voltage.

Moreover, the base field plates 17 and the top field plates 18 are provided on the p-type RESURF layer 13 via the field insulating film 16. This further flattens the electric field distribution on the substrate surface and thereby further stabilizes the withstand voltage.

Figure 4:
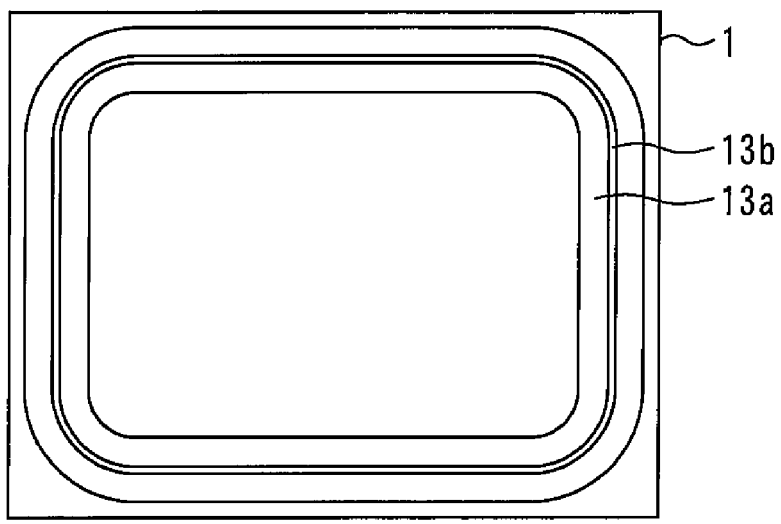
FIG. 4 is a plan view illustrating the p-type RESURF layer according to the first embodiment of the present invention.
Figure 5:
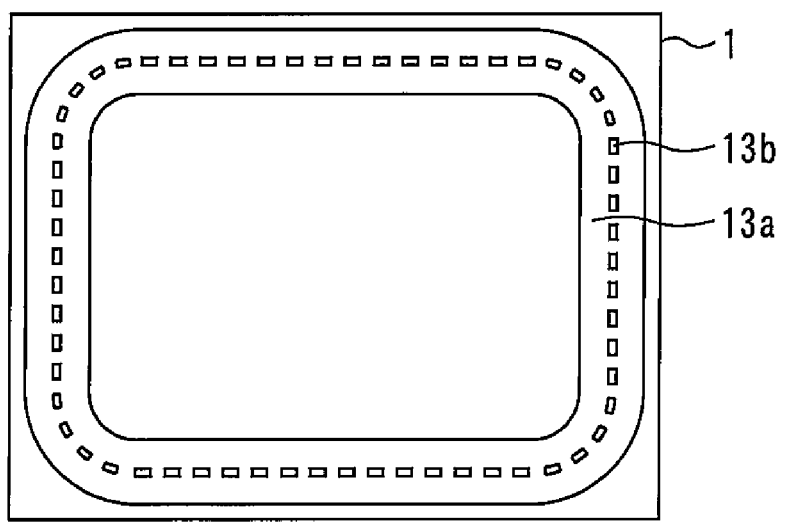
FIG. 5 is a plan view illustrating a modification example of the p-type RESURF layer according to the first embodiment of the present invention.

FIG. 4 is a plan view illustrating the p-type RESURF layer according to the first embodiment of the present invention. Components other than the p-type RESURF layer 13 are omitted. The high concentration layer 13b is continuously provided in a track shape. FIG. 5 is a plan view illustrating a modification example of the p-type RESURF layer according to the first embodiment of the present invention. The high concentration layer 13b is arranged like a dotted line. In both examples, since an average concentration at the center of the p-type RESURF layer 13 is higher than that at the inner end and the outer end, the electric field distribution is flattened.

Second Embodiment

Figure 6:
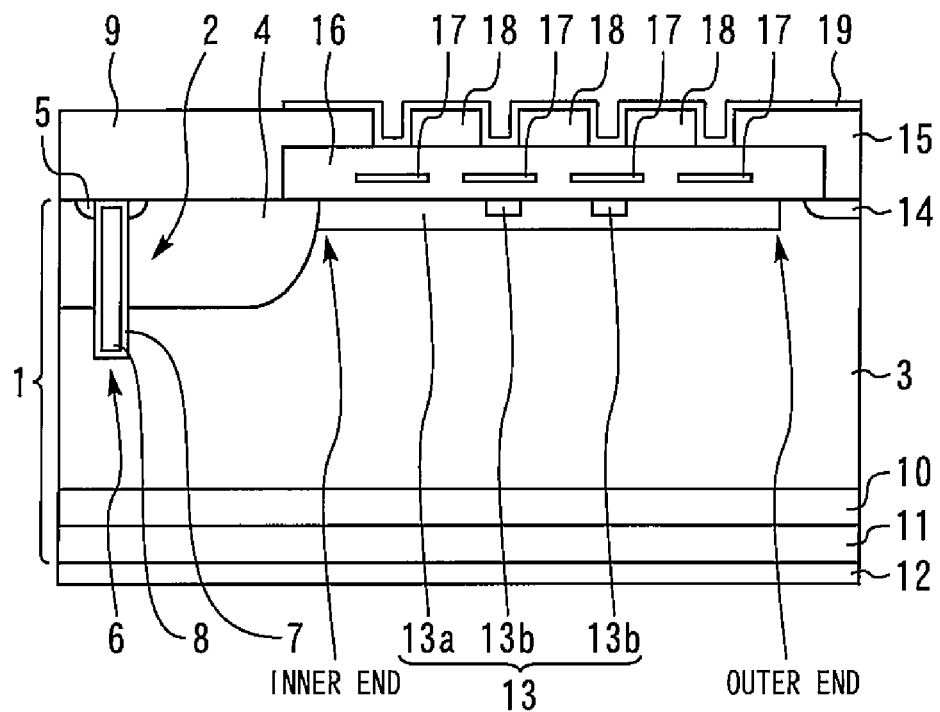
FIG. 6 is a cross-sectional view illustrating a semiconductor device according to a second embodiment of the present invention.

FIG. 6 is a cross-sectional view illustrating a semiconductor device according to a second embodiment of the present invention. In the present embodiment, the p-type RESURF layer 13 includes two high concentration layers 13b. This further flattens an electric field distribution on the substrate surface and thereby further stabilizes the withstand voltage.

As a result, it is possible to improve an operating voltage and also further reduce the area occupied by the termination structure.

Third Embodiment

Figure 7:
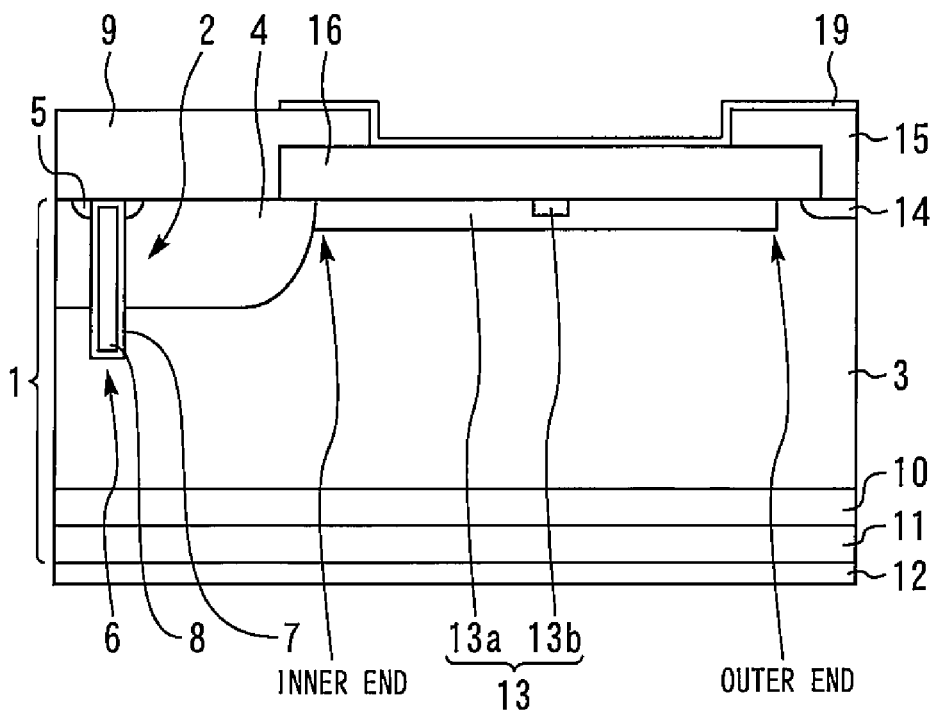
FIG. 7 is a cross-sectional view illustrating a semiconductor device according to a third embodiment of the present invention.

FIG. 7 is a cross-sectional view illustrating a semiconductor device according to a third embodiment of the present invention. There is neither base field plate 17 nor top field plate 18 in the present embodiment. The withstand voltage can be stabilized by the high concentration layer 13b of the p-type RESURF layer 13 even when the field plates are omitted in this way. Therefore, a cost reduction can be achieved by cutting on the field plate members.

Fourth Embodiment

Figure 8:
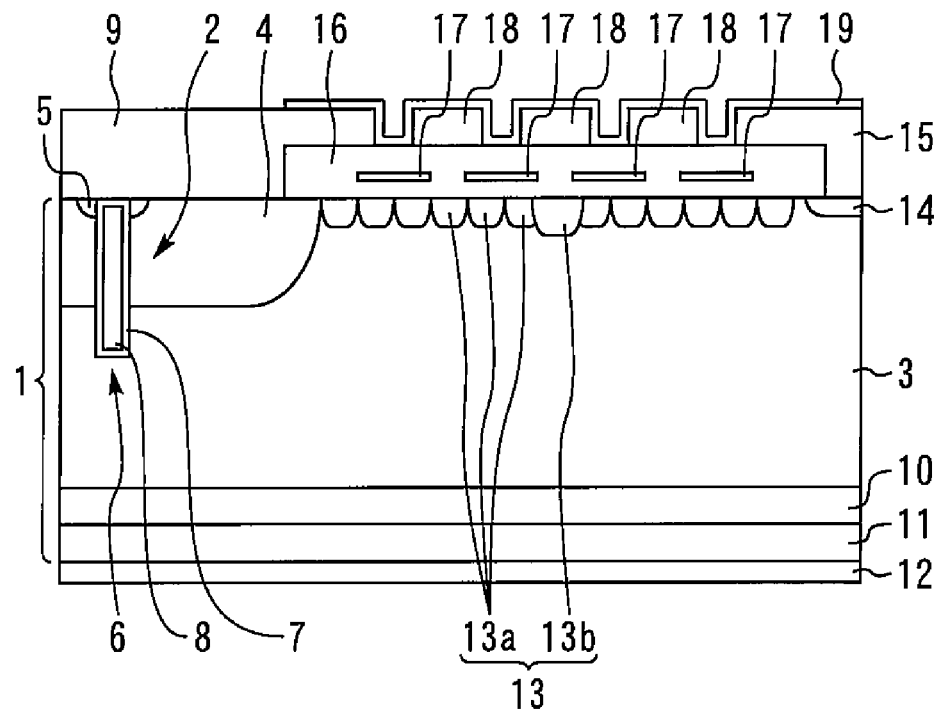
FIG. 8 is a cross-sectional view illustrating a semiconductor device according to a fourth embodiment of the present invention.
Figure 9:
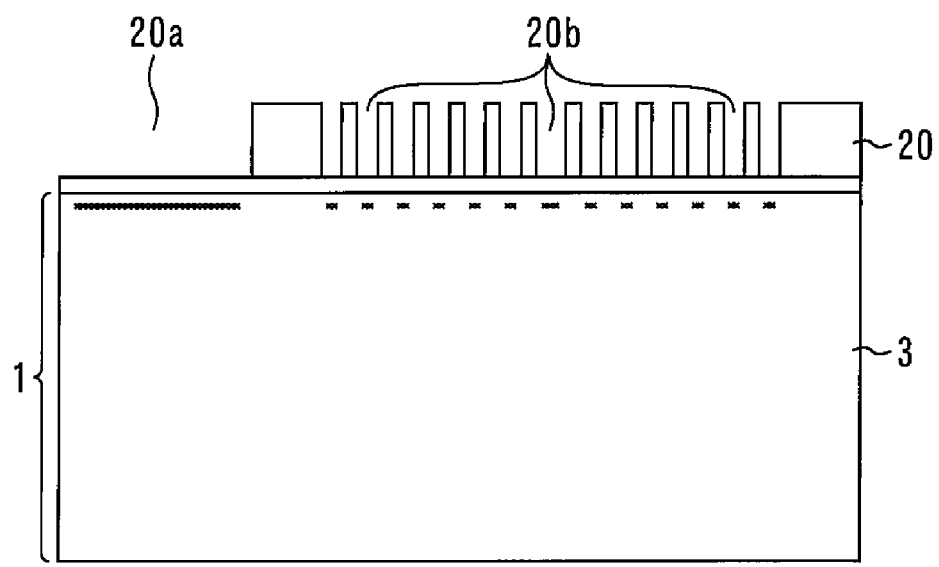
FIG. 9 is a cross-sectional view illustrating a step of manufacturing a semiconductor device according to a fourth embodiment of the present invention.

FIG. 8 is a cross-sectional view illustrating a semiconductor device according to a fourth embodiment of the present invention. In the present embodiment, the p-type RESURF layer 13 is made up of a plurality of diffusion layers, neighboring parts of which overlap with each other. Since the present embodiment has a feature of the method of manufacturing the structure thereof, the method of manufacturing the device will be described. FIG. 9 is a cross-sectional view illustrating a step of manufacturing a semiconductor device according to a fourth embodiment of the present invention.

First, a photoresist 20 is formed which includes a first opening 20a and a plurality of second openings 20b arranged on an outer circumference of the first opening 20a on the $n^-$-type layer 3 of the substrate 1 using a photoengraving process. In this case, the first opening 20a is formed in the whole region where the p-type well 4 is formed and the plurality of small second openings 20b are formed in the region where the p-type RESURF layer 13 is formed. The areas and intervals of the openings are controlled so that the amount of impurity per unit area injected into the p-type RESURF layer 13 satisfies a RESURF condition. Furthermore, the area of the second openings 20b in the region where the high concentration layer 13b is formed is made to be greater than the area of the region where the low concentration layer 13a is formed. That is, the area of the second openings 20b arranged in the region between the inner end and the outer end is greater than the area of the second openings 20b arranged at the inner end on the first opening 20a side and the outer end on the outer circumferential side.

Next, p-type impurity such as boron is injected into the $n^-$-type layer 3 of the substrate 1 using the photoresist 20 as a mask, heat treatment is applied thereto to form the p-type well 4 in the active region, and the flat p-type RESURF layer 13 is simultaneously formed on the outer circumference of the p-type well 4 as a termination structure. In this case, by setting the opening as described above, the diffusion layer making up the high concentration layer 13b becomes wider than the diffusion layer making up the low concentration layer 13a. After that, a general semiconductor manufacturing step is performed.

As described above, in the present embodiment, the p-type well 4, and the low concentration layer 13a and the high concentration layer 13b of the p-type RESURF layer 13 can be formed in the same step. It is thereby possible to simplify the manufacturing flow and reduce the manufacturing cost.

Fifth Embodiment

Figure 10:
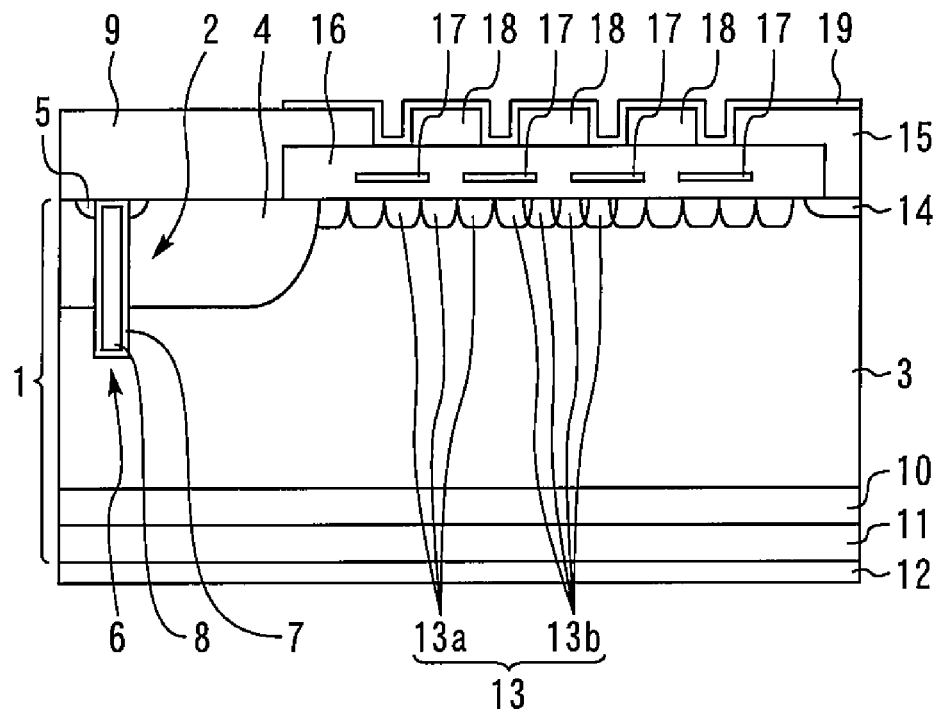
FIG. 10 is a cross-sectional view illustrating a semiconductor device according to a fifth embodiment of the present invention.

FIG. 10 is a cross-sectional view illustrating a semiconductor device according to a fifth embodiment of the present invention. The present embodiment is common to the fourth embodiment in that the p-type well 4, and the low concentration layer 13a and the high concentration layer 13b of the p-type RESURF layer 13 are formed in the same step. However, the interval of the plurality of second openings 20b in the region where the high concentration layer 13b is formed is made to be smaller than that of the region where the low concentration layer 13a is formed. That is, the interval of the second openings 20b arranged in the region between the inner end and the outer end is smaller than the interval of the second openings 20b arranged at the inner end on the first opening 20a side and the outer end on the outer circumferential side. In this way, the interval of the diffusion layers making up the high concentration layer 13b is narrower than the interval of the diffusion layers making up the low concentration layer 13a. This method can equalize the widths of the plurality of second openings 20b that form the low concentration layer 13a and the high concentration layer 13b.

The rest of the configuration and manufacturing step are the same as those of the fourth embodiment, and it is possible to simplify the manufacturing flow and reduce the manufacturing cost as in the case of the fourth embodiment.

Sixth Embodiment

Figure 11:
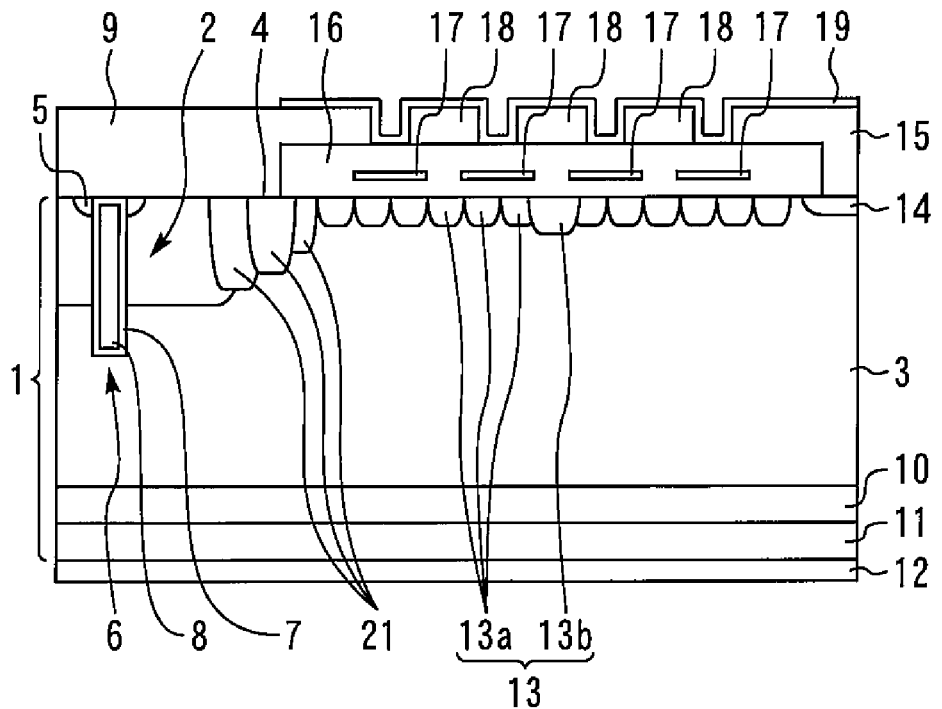
FIG. 11 is a cross-sectional view illustrating a semiconductor device according to a sixth embodiment of the present invention.

FIG. 11 is a cross-sectional view illustrating a semiconductor device according to a sixth embodiment of the present invention. A $p^-$-type buffering layer 21 is provided between the p-type well 4 and the p-type RESURF layer 13. An average concentration of the $p^-$-type buffering layer 21 gradually decreases toward an outer circumferential side. In the manufacturing method according to the fourth embodiment, the width and interval of the opening of the photoresist 20 in the portion where the $p^-$-type buffering layer 21 is formed are adjusted so that the average concentration gradually decreases toward the outer circumferential side.

Since the electric field on the emitter side can be relaxed by the $p^-$-type buffering layer 21, the withstand voltage can be further stabilized. The $p^-$-type buffering layer 21 can be formed in the same steps as those of the p-type well 4 and the p-type RESURF layer 13. It is thereby possible to simplify the manufacturing flow and reduce the manufacturing cost.

A case has been described in the present embodiment where the high concentration layer 13b is formed in the low concentration layer 13a having a certain concentration, but the low concentration layer 13a may have a concentration gradient such that the concentration gradually decreases from the p-type well 4 (inner end) side toward the n-type channel stopper 14 (outer end) side. In this case, a similar effect can also be obtained by forming the high concentration layer 13b so that the concentration becomes higher than that in the periphery. Forming the high concentration layer 13b having a higher impurity concentration than the low concentration layer 13a in a region where the electric field is relatively small is important from the standpoint of achieving the effects of improvement of withstand voltage and stabilization in the semiconductor device using a RESURF structure as the termination structure.

Note that the present invention is not limited to the above embodiments, but is also applicable to a combination thereof. The semiconductor element provided for the p-type well 4 is not limited to the IGBT, but MOSFET, bipolar transistor, diode or the like may also be used.

In the above embodiments, the p-type well 4 and the p-type RESURF layer 13 are formed on the $n^-$-type layer 3, but without being limited to this, the conductive types of the respective layers may be reversed. That is, the present invention is also applicable to a structure in which an n-type well and an n-type RESURF layer are formed on a p-type layer.

The substrate 1 is not limited to one made of silicon, but may be one made of a wide band gap semiconductor having a wider band gap than silicon. The wide band gap semiconductor is, for example, silicon carbide, nitride gallium-based material or diamond. A power semiconductor element formed of such a wide band gap semiconductor has a high withstand voltage and a high maximum allowable current density, and can thereby be downsized. Using this downsized element also allows a semiconductor module incorporating the element to be downsized. Since the element has a high heat-resistance, a radiator fin of a heat sink can be downsized and a water-cooling part can be replaced by an air-cooling one, which further allows downsizing of the semiconductor module. Furthermore, since the element has low power loss and high efficiency, it is possible to increase the efficiency of the semiconductor module.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-080695, filed on Apr. 8, 2013 including specification, claims, drawings and summary, on which the Convention priority of the present application is based, is incorporated herein by reference in its entirety.

What is claimed is:

1. A semiconductor device comprising:
a substrate including a layer of a first conductivity type;
a well of a second conductivity type on the layer of the first conductivity type in an active region in a center region of the substrate; and
a flat RESURF layer of the second conductivity type on the layer of the first conductivity type on an outer circumference of the well as a termination structure, wherein
the RESURF layer includes a low concentration layer arranged at an inner end on the well side and an outer end on the outer circumferential side, and a high concentration layer arranged between the inner end and the outer end and having a higher impurity concentration than the low concentration layer, and
the RESURF layer surrounds the active region.

2. The semiconductor device according to claim 1, further comprising a plurality of field plates on the RESURF layer via an insulating film.

3. The semiconductor device according to claim 1, wherein the RESURF layer includes a plurality of diffusion layers.

4. A semiconductor device comprising:
a layer of a first conductivity type;
a well of a second conductivity type on the layer of the first conductivity type in an active region; and
a flat RESURF layer of the second conductivity type on the layer of the first conductivity type on an outer circumference of the well as a termination structure, wherein
the RESURF layer includes a low concentration layer arranged at an inner end on the well side and an outer end on the outer circumferential side, and a high concentration layer arranged between the inner end and the outer end and having a higher impurity concentration than the low concentration layer,
the RESURF layer includes a plurality of diffusion layers, and
the diffusion layer making up the high concentration layer is wider than the diffusion layer making up the low concentration layer.

5. A semiconductor device comprising:
a layer of a first conductivity type;
a well of a second conductivity type on the layer of the first conductivity type in an active region; and
a flat RESURF layer of the second conductivity type on the layer of the first conductivity type on an outer circumference of the well as a termination structure, wherein
the RESURF layer includes a low concentration layer arranged at an inner end on the well side and an outer end on the outer circumferential side, and a high concentration layer arranged between the inner end and the outer end and having a higher impurity concentration than the low concentration layer,
the RESURF layer includes a plurality of diffusion layers, and
an interval of the diffusion layers making up the high concentration layer is narrower than an interval of the diffusion layers making up the low concentration layer.

* * * * *